United States Patent
Takahashi et al.

(10) Patent No.: US 10,033,052 B2
(45) Date of Patent: Jul. 24, 2018

(54) TITANIUM MATERIAL OR TITANIUM ALLOY MATERIAL HAVING SURFACE ELECTRICAL CONDUCTIVITY, AND FUEL CELL SEPARATOR AND FUEL CELL USING THE SAME

(71) Applicant: NIPPON STEEL & SUMITOMO METAL CORPORATION, Tokyo (JP)

(72) Inventors: Kazuhiro Takahashi, Tokyo (JP); Taku Kagawa, Tokyo (JP); Masanari Kimoto, Tokyo (JP); Junko Imamura, Tokyo (JP); Kiyonori Tokuno, Tokyo (JP); Atsuhiko Kuroda, Tokyo (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 230 days.

(21) Appl. No.: 15/100,890

(22) PCT Filed: Jan. 22, 2015

(86) PCT No.: PCT/JP2015/051665
§ 371 (c)(1),
(2) Date: Jun. 1, 2016

(87) PCT Pub. No.: WO2015/111652
PCT Pub. Date: Jul. 30, 2015

(65) Prior Publication Data
US 2016/0308222 A1    Oct. 20, 2016

(30) Foreign Application Priority Data

Jan. 22, 2014 (JP) ................. 2014-009352

(51) Int. Cl.
*H01M 8/0228* (2016.01)
*C25D 9/08* (2006.01)
(Continued)

(52) U.S. Cl.
CPC .......... *H01M 8/0228* (2013.01); *C22C 14/00* (2013.01); *C22F 1/18* (2013.01); *C22F 1/183* (2013.01);
(Continued)

(58) Field of Classification Search
None
See application file for complete search history.

(56) References Cited

U.S. PATENT DOCUMENTS 4,127,709 A * 11/1978 Ruben ............... C25D 5/38
                                                          205/181
2009/0087558 A1 * 4/2009 Aoyama ............ C23C 8/04
                                                          427/228
(Continued)

FOREIGN PATENT DOCUMENTS

EP   2 031 687 A1   3/2009
JP   2000-328200 A  11/2000
(Continued)

OTHER PUBLICATIONS

Ren et al.; "In situ synthesis of TiH2 layer on metallic titanium foil through gaseous hydrogen free acid-hydrothermal method." Materials Research Bulletin, vol. 50, Feb. 2014, p. 379-384.*
(Continued)

*Primary Examiner* — Alix Eggerding
(74) *Attorney, Agent, or Firm* — Birch, Stewart, Kolasch & Birch, LLP

(57) ABSTRACT

The composition ratio of a titanium hydride $[I_{Ti-H}/(I_{Ti}+I_{Ti-H})]\times 100$ found from the maximum intensity of metal titanium $(I_{Ti})$ and the maximum intensity of the titanium hydride $(I_{Ti-H})$ of the X-ray diffraction peaks measured at a surface of a titanium or a titanium alloy at an incident angle to the surface of 0.3° is 55% or more, a titanium oxide film is formed on an outermost surface of the titanium or the (Continued)

titanium alloy, and C is at 10 atomic % or less, N is at 1 atomic % or less, and B is at 1 atomic % or less in a position where the surface has been subjected to sputtering of 5 nm with argon. The titanium oxide film is formed by performing stabilization treatment after performing passivation treatment in prescribed aqueous solutions, and has a thickness of 3 to 10 nm.

3 Claims, 3 Drawing Sheets

(51) Int. Cl.

| | | |
|---|---|---|
| C22C 14/00 | (2006.01) | |
| C22F 1/18 | (2006.01) | |
| H01M 8/0206 | (2016.01) | |
| H01M 8/0215 | (2016.01) | |
| H01M 8/0245 | (2016.01) | |
| C23C 14/08 | (2006.01) | |
| C23C 14/34 | (2006.01) | |
| C23C 22/83 | (2006.01) | |
| C23C 22/54 | (2006.01) | |
| C23G 1/10 | (2006.01) | |
| C25D 9/12 | (2006.01) | |
| C25D 11/00 | (2006.01) | |
| H01M 8/1018 | (2016.01) | |

(52) U.S. Cl.
CPC ............ *C23C 14/083* (2013.01); *C23C 14/34* (2013.01); *C23C 22/54* (2013.01); *C23C 22/83* (2013.01); *C23G 1/106* (2013.01); *C25D 9/08* (2013.01); *C25D 9/12* (2013.01); *C25D 11/00* (2013.01); *H01M 8/0206* (2013.01); *H01M 8/0215* (2013.01); *H01M 8/0245* (2013.01); *H01M 8/1018* (2013.01); *H01M 2008/1095* (2013.01); *H01M 2300/0065* (2013.01)

(56) References Cited

U.S. PATENT DOCUMENTS

| | | | |
|---|---|---|---|
| 2009/0197143 A1 | 8/2009 | Kaneko et al. | |
| 2010/0233587 A1 | 9/2010 | Sato et al. | |
| 2011/0177430 A1 | 7/2011 | Takahashi et al. | |
| 2012/0058002 A1* | 3/2012 | Ivasishin | B22F 1/0003 419/28 |
| 2012/0171468 A1 | 7/2012 | Tanaka et al. | |
| 2014/0255816 A1 | 9/2014 | Kaminaka et al. | |
| 2015/0147678 A1 | 5/2015 | Kihira et al. | |

FOREIGN PATENT DOCUMENTS

| | | |
|---|---|---|
| JP | 2004-273370 A | 9/2004 |
| JP | 2005-36314 A | 2/2005 |
| JP | 2005-38823 A | 2/2005 |
| JP | 2005-56776 A | 3/2005 |
| JP | 2005-209399 A | 8/2005 |
| JP | 2006-140095 A | 6/2006 |
| JP | 2006-156258 A | 6/2006 |
| JP | 2006-190643 A | 7/2006 |
| JP | 2007-5084 A | 1/2007 |
| JP | 2007-131947 A | 5/2007 |
| JP | 2007-234244 A | 9/2007 |
| JP | 2009-238560 A | 10/2009 |
| JP | 4361834 B2 | 11/2009 |
| JP | 2009-289511 A | 12/2009 |
| JP | 2010-97840 A | 4/2010 |
| JP | 2010-108673 A | 5/2010 |
| JP | 2010-129458 A | 6/2010 |
| JP | 2010-236083 A | 10/2010 |
| JP | 2010-248570 A | 11/2010 |
| JP | 2010-248572 A | 11/2010 |
| JP | 2011-77018 A | 4/2011 |
| JP | 2012-28045 A | 2/2012 |
| JP | 2012-28046 A | 2/2012 |
| JP | 2012-28047 A | 2/2012 |
| JP | 2012-43775 A | 3/2012 |
| JP | 2012-43776 A | 3/2012 |
| JP | 2013-109891 A | 6/2013 |
| RU | 2231172 C2 | 6/2004 |
| RU | 2461100 C1 | 9/2012 |
| TW | 200810198 A | 2/2008 |
| WO | WO 2010/038544 A1 | 4/2010 |
| WO | WO 2011/016465 A1 | 2/2011 |
| WO | WO 2013/073076 A1 | 5/2013 |
| WO | WO 2014/021298 A1 | 2/2014 |
| WO | WO 2015/111653 A1 | 7/2015 |

OTHER PUBLICATIONS

Extended European Search Report, dated May 4, 2017, for corresponding European Application No. 15740971.5.
Korean Office Action dated Sep. 19, 2017, issued in corresponding Korean Patent Application No. 10-2016-7018869 with English translation.
International Search Report for PCT/JP2015/051665 dated Apr. 14, 2015.
Lütjering et al., "Ti-2003 Science and Technology", Wiley-VCH Verlag GmbH & Co. KGaA, Hamburg, 2004, pp. 3117-3124, total 11 pages.
Written Opinion of the International Searching Authority for PCT/JP2015/051665 (PCT/ISA/237) dated Apr. 14, 2015.
Canadian Office Action, dated Jul. 7, 2017, for corresponding Canadian Application No. 2,935,525.
Ren et al., "In situ synthesis of $TiH_2$ layer on metallic titanium foil through gaseous hydrogen free acid-hydrothermal method," Materials Research Bulletin, vol. 50, 2014 (Available online Nov. 9, 2013), pp. 379-384.
Russian Office Action and Search Report, dated Aug. 9, 2017, for corresponding Application No. 2016128720/02, with an English translation.
Tanaka et al., "The Preparation of Porous $TiO_2$ by Immersing Ti in NaOH Solution," Journal of the Electrochemical Society, vol. 149, No. 11, 2002 (Available electronically Oct. 2, 2002), pp. D167-D171.
Chinese Office Action and Search Report, dated Jan. 30, 2018 for corresponding Chinese Application No. 201580004815.X, with an English machine translation of the Chinese Office Action.
Canadian Office Action, dated Mar. 26, 2018, for Canadian Application No. 2,935,525.

\* cited by examiner (a)

(b)

TITANIUM MATERIAL OR TITANIUM ALLOY MATERIAL HAVING SURFACE ELECTRICAL CONDUCTIVITY, AND FUEL CELL SEPARATOR AND FUEL CELL USING THE SAME

TECHNICAL FIELD

The present invention is an invention relating to a titanium material or a titanium alloy material of which a surface has electrical conductivity and excellent corrosion resistance, and is suitable particularly for a titanium material or a titanium alloy material used for a low-contact-resistance polymer electrolyte fuel cell separator used for automobiles using electric power as the drive source, electricity generating systems, etc., that is, a titanium material or a titanium alloy material for a fuel cell separator having excellent contact-to-carbon electrical conductivity and excellent durability, and a fuel cell separator and a fuel cell using the same. Hereinbelow, a description is given using a fuel cell separator as an example.

BACKGROUND ART

These days, the development of polymer electrolyte fuel cells, as fuel cells for automobiles, is beginning to progress rapidly. The polymer electrolyte fuel cell is a fuel cell in which hydrogen and oxygen are used and an organic substance film of a hydrogen-ion-selective permeability type (also the development of compositing with an inorganic substance is in progress) is used as the electrolyte. As the hydrogen of fuel, hydrogen gas obtained by the reforming of alcohols etc. is used as well as pure hydrogen.

However, in the existing fuel cell systems, the unit prices of components and members are high, and large decreases in the costs of the components and members are essential for the application to consumer products. In the application to automobile uses, not only cost reduction but also the compactification of a stack that forms the heart of the fuel cell is desired.

The polymer electrolyte fuel cell has a structure in which separators push both sides of a unit called a membrane electrode assembly (hereinafter occasionally referred to as an "MEA") in which a polymer electrolyte film, an electrode, and a gas diffusion layer are integrated, and this structure is stacked in multiple layers to form a stack.

The properties required for the separator are to have electron conductivity, isolation properties between the oxygen gas and the hydrogen gas of both electrodes, low contact resistance with the MEA, good durability in the environment in the fuel cell, etc. Here, of the MEA, the gas diffusion layer (GDL) is generally made of carbon paper in which carbon fibers are integrated, and hence it is desired for the separator to have good contact-to-carbon electrical conductivity.

Stainless steel, titanium material, etc. as the material for the separator generally have low contact-to-carbon electrical conductivity in the state as they are, and hence many proposals has been made in order to enhance the contact-to-carbon electrical conductivity. The presence of a passive film with low electrical conductivity is an obstacle to enhance the contact-to-carbon electrical conductivity. Although this problem can be solved by sacrificing the durability, the interior of the fuel cell becomes a severe corrosion environment, and hence very high durability is required for the separator.

Thus, it is a reality that the development of a satisfying metal material for the separator is extremely difficult. Thus far, a carbon separator has been the mainstream, but when a metal separator is put to practical use, the fuel cell itself can be compactified and it can be ensured that cracking does not occur during the fuel cell production process; thus, the metallization of the separator is essential for mass production and spread.

In such a background, for example, Patent Literature 1 discloses a technology in which a special stainless steel in which a compound having electrical conductivity is precipitated in steel material is used from the viewpoints of thinness, weight reduction, etc. and thus the contact resistance of the stainless steel is allowed to be effectively reduced.

Also the use of titanium, which has good durability, for the separator is being investigated. Also in the case of titanium, the contact resistance with the MEA is high due to the presence of a passive film on the outermost surface of the titanium, like in stainless steel. Thus, for example, Patent Literature 2 discloses a technology in which a TiB-based precipitate is dispersed in titanium to reduce the contact resistance with the MEA.

Patent Literature 3 discloses a titanium alloy for a separator made of a titanium alloy in which Ta is contained at 0.5 to 15 mass % and the amounts of Fe and O are restricted as necessary, and in which the average nitrogen concentration of the area extending 0.5 µm in depth from the outermost surface is 6 atomic % or more and tantalum nitride and titanium nitride are present in the area.

Patent Literature 3 also discloses a method for producing a titanium alloy for a separator, in which heating is performed in the temperature range of 600 to 1000° C. for 3 seconds or more in a nitrogen atmosphere.

Patent Literatures 4, 5 and 6 disclose technologies in which an electrically conductive substance is pushed into an outer layer portion by the blasting method or the roll processing method in the production process of a metal separator made of titanium or stainless steel. In this technology, both to-carbon electrical conductivity and durability are achieved by a surface fine structure in which the electrically conductive substance is placed so as to penetrate through a passive film of the metal surface.

Patent Literature 7 discloses a method for producing a fuel cell separator in which an impurity containing titanium carbide or titanium nitride formed on a titanium surface is converted to an oxide by anodic oxidation treatment and then plating treatment is performed. The titanium carbide or the titanium nitride formed on the titanium surface is dissolved during the exposure to a corrosion environment and is re-precipitated as an oxide that inhibits the contact electrical conductivity, and reduces the contact electrical conductivity.

The method mentioned above suppresses the oxidation of the impurity during electricity generation (during use), and thus enhances the durability. However, an expensive plating film is indispensable in order to ensure electrical conductivity and durability.

Patent Literature 8 discloses a technology in which a titanium-based alloy obtained by alloying a group 3 element of the periodic table is used as the base material, BN powder is applied to the surface of the base material, and heating treatment is performed to form an oxide film to form a corrosion-resistant electrically conductive film.

This technology enhances the electrical conductivity by doping an impurity atom into the position of a titanium atom in the crystal lattice of the oxide film, which forms a passive film of the titanium alloy.

Patent Literatures 9 and 10 disclose technologies in which, when a fuel cell separator made of titanium is subjected to rolling processing, a carbon-containing rolling oil is used to perform rolling to form an altered layer containing titanium carbide on the outer layer and form thereon a carbon film with high film density, and electrical conductivity and durability are thus ensured.

In these technologies, although the electrical conductivity to carbon paper is enhanced, the durability is maintained by the carbon film and hence it is necessary to form a dense carbon film. Since contact resistance is high at a simple interface between carbon and titanium, titanium carbide, which enhances the electrical conductivity, is placed therebetween. However, if there is a defect in the carbon film, the corrosion of the altered layer (containing titanium carbide) and the base material cannot be prevented, and a corrosion product that inhibits the contact electrical conductivity may be produced.

Patent Literatures 11, 12, 13, 14 and 15 disclose titanium and fuel cell separators made of titanium that include, as the main structure, a carbon layer/a titanium carbide intermediate layer/a titanium base material, whose structures are similar to the structure described in Patent Literature 9. Although the production procedure of forming a carbon layer beforehand and then forming a titanium carbide intermediate layer is different from the production procedure described in Patent Literature 9, the mechanism of enhancing the durability by means of a carbon layer is similar.

Patent Literature 16 discloses a technology in which, for the purpose of mass production, graphite powder is applied and rolling is performed, and annealing is performed. This technology has achieved the function of the conventional carbon separator by providing a carbon layer and a titanium carbide intermediate layer on the base material titanium surface free from cracking. However, the titanium carbide intermediate layer does not have durability; hence, if there is a defect in the carbon layer, the corrosion of the titanium carbide intermediate layer and the base material cannot be prevented, and it is concerned that a surface structure could allow the production of a corrosion product that inhibits the contact electrical conductivity.

In this actual situation, Patent Literature 17 discloses a technology in which titanium carbide or titanium nitride, as an electrically conductive substance, is placed on a titanium surface, and these electrically conductive substances as well as the titanium are covered with a titanium oxide having passivation action. Although this technology ensures a contact electrical conductivity and also improves the durability, in order to further prolong the fuel cell lifetime, it is necessary to further enhance the environmental deterioration resistance of the titanium oxide film that covers the electrically conductive substance.

Thus, the present applicant has proposed, in Patent Literature 18, a titanium or a titanium alloy material for a fuel cell separator in which, while durability enhancement by subjecting a titanium oxide film to a passivation treatment in which immersion is performed in an aqueous solution containing an oxidizing agent such as nitric acid or chromic acid is taken as a basis, titanium compound particles containing carbon or nitrogen, which are minute electrically conductive objects, are dispersed in the oxide film of the surface of the titanium or the titanium alloy material, and thus the contact-to-carbon electrical conductivity is enhanced.

The present applicant has proposed, in Patent Literature 19, using a carbide, a nitride, a carbonitride, or a boride of tantalum, titanium, vanadium, zirconium, or chromium as minute electrically conductive objects and performing stabilization treatment after passivation treatment in aqueous solutions. The stabilization treatment uses an aqueous solution containing rice flour, wheat flour, potato starch, corn flour, soybean flour, a pickling corrosion inhibitor, or the like, which is a naturally derived substance or an artificially synthesized substance containing one or more of an amine-based compound, an aminocarboxylic acid-based compound, a phospholipid, a starch, calcium ions, and polyethylene glycol.

The internal environment of the polymer electrolyte fuel cell and the conditions of simulation evaluations thereof will now be described.

Patent Literatures 20, 21, 22, 23 and 24 discloses that a minute amount of fluorine is dissolved out and a hydrogen fluoride environment is produced when a fluorine-based polymer electrolyte is used for the electrolyte film. It is presumed that there is no dissolving-out of fluorine from the electrolyte film when a hydrocarbon polymer is used.

Patent Literature 24 discloses that the pH of a discharged liquid is made approximately 3 experimentally. In Patent Literature 10, a potentiostatic corrosion test in which an electric potential of 1 V is applied in a sulfuric acid aqueous solution at pH 4 and 50° C. is employed, and in Patent Literatures 11, 12, 13 and 14, a durability evaluation test in which an electric potential of 0.6 V is applied in a sulfuric acid aqueous solution at approximately pH 2 and 80° C. is employed.

Patent Literature 25 discloses an operating temperature being 80 to 100° C. In Patent Literatures 21 and 24, 80° C. is used as an evaluation condition. From the above, it is easily supposed that the evaluation conditions for simulating a polymer electrolyte fuel cell are (1) an aqueous solution at pH 2 to 4 in which fluorine is dissolved due to the polymer electrolyte of the electrolyte film, (2) a temperature of 50 to 100° C., and (3) a cell voltage change of 0 to 1 V (the voltage being 0 before electricity generation).

On the other hand, from the viewpoint of the environment resistance of titanium, it is known that titanium is dissolved in a hydrogen fluoride aqueous solution (hydrofluoric acid). Non-Patent Literature 1 discloses that the color change of titanium is promoted when fluorine is added at approximately 2 ppm or approximately 20 ppm to a sulfuric acid aqueous solution at pH 3.

Patent Literature 26 discloses a method in which a titanium alloy containing one or more elements of the platinum group-based elements (Pd, Pt, Ir, Ru, Rh, and Os), Au, and Ag is immersed in a non-oxidizing acid to form on the surface a layer containing them in a total amount of 40 to 100 atomic %. Patent Literature 27 discloses a titanium material for a separator in which a titanium alloy containing 0.005 to 0.15 mass % of one or more platinum group elements and 0.002 to 0.10 mass % of one or more rare-earth elements is pickled with a non-oxidizing acid to concentrate the one or more platinum group elements on the surface. Patent Literature 28 discloses a titanium material comprising a layer containing a titanium hydride in the titanium material surface.

The color change phenomenon described in Patent Literature 25 is a phenomenon in which interference colors occur as a result of the fact that titanium is dissolved and re-precipitated as an oxide on the surface and an oxide film has grown. Since the re-precipitated oxide is a substance that inhibits the contact electrical conductivity as described above, the environment in which fluorine is dissolved out in the fuel cell is a more severe environment to titanium; thus, it is necessary to further enhance the durability in order not to increase the contact resistance.

CITATION LIST

Patent Literature

Patent Literature 1: JP 2000-328200A
Patent Literature 2: JP 2004-273370A
Patent Literature 3: JP 2007-131947A
Patent Literature 4: JP 2007-005084A
Patent Literature 5: JP 2006-140095A
Patent Literature 6: JP 2007-234244A
Patent Literature 7: JP 2010-097840A
Patent Literature 8: JP 2010-129458A
Patent Literature 9: JP 2010-248570A
Patent Literature 10: JP 2010-248572A
Patent Literature 11: JP 2012-028045A
Patent Literature 12: JP 2012-028046A
Patent Literature 13: JP 2012-043775A
Patent Literature 14: JP 2012-043776A
Patent Literature 15: JP 2012-028047A
Patent Literature 16: JP 2011-077018A
Patent Literature 17: WO 2010/038544
Patent Literature 18: WO 2011/016465
Patent Literature 19: Patent Application No. 2012-170363
Patent Literature 20: JP 2005-209399A
Patent Literature 21: JP 2005-056776A
Patent Literature 22: JP 2005-038823A
Patent Literature 23: JP 2010-108673A
Patent Literature 24: JP 2009-238560A
Patent Literature 25: JP 2006-156288A
Patent Literature 26: JP 2006-190643A
Patent Literature 27: JP 2013-109891A
Patent Literature 28: JP 4361834B Non-Patent Literature Non-Patent Literature 1: G. Lutjering and J. Albrecht: Ti-2003 Science and Technology, Wiley-VCH Verlag GmbH & Co., Hamburg, 2004, pp. 3117-3124.

SUMMARY OF INVENTION

Technical Problem

The problem to be solved by the present invention is to enhance the contact-to-carbon electrical conductivity (low contact resistance) and the durability in a titanium material or a titanium alloy material for a fuel cell separator with high contact-to-carbon electrical conductivity and further prolong the lifetime of the fuel cell. The durability is specifically (1) the corrosion resistance to F ions (fluoride ions) and (2) the durability to the applied voltage in an acidic environment.

Solution to Problem

Conventionally, as the technology of reducing the contact resistance between titanium and titanium alloy and carbon, a technology in which the surface of titanium and titanium alloy is coated with a carbon (electrically conductive substance) layer, a technology in which a carbide, a nitride, a carbonitride, and/or a boride of titanium, tantalum, or the like is finely dispersed in an oxide film of the surface, or a technology in which a platinum group element, Au, or Ag is concentrated on the surface has been the mainstream.

However, the present inventors made extensive research on the method to solve the problem mentioned above regardless of the conventional technologies. Consequently, it has been revealed that the surface structure of the titanium material or the titanium alloy material greatly influences the contact-to-carbon electrical conductivity and the durability.

Furthermore, as a result of further extensive research by the present inventors, the present inventors have found that, fundamentally unlike the conventional technologies that utilize a carbon layer (electrically conductive substance), the carbide, nitride, carbonitride, and/or boride mentioned above, or a platinum group element, Au, or Ag, the problem mentioned above can be solved by a titanium hydride in a prescribed form being formed on the surface of the titanium and the titanium alloy and forming a titanium oxide film on the outermost surface. The present inventors have also found that the effect of the present invention is exhibited regardless of whether a platinum group-based element, Au, or Ag is contained in the surface or not.

The present invention has been made on the basis of the above findings, and its summary is as follows.

[1]

A titanium material or a titanium alloy material, wherein the composition ratio of a titanium hydride $[I_{Ti-H}/(I_{Ti}+I_{Ti-H})]\times 100$ found from the maximum intensity of metal titanium ($I_{Ti}$) and the maximum intensity of the titanium hydride ($I_{Ti-H}$) of the X-ray diffraction peaks measured at a surface of a titanium or a titanium alloy at an incident angle to the surface of 0.3° is 55% or more, a titanium oxide film is formed on an outermost surface of the titanium or the titanium alloy, C is at 10 atomic % or less, N is at 1 atomic % or less, and B is at 1 atomic % or less in a position where the surface has been subjected to sputtering of 5 nm with argon, and each of the amounts of increase in contact resistance from before to after deterioration test 1 and deterioration test 2 below is 10 mΩcm² or less, deterioration test 1: immersion for 4 days in a sulfuric acid solution at 80° C. and pH 3 containing 2 ppm F ions, deterioration test 2: application of an electric potential of 1.0 V (vs. SHE) for 24 hours in a sulfuric acid solution at 80° C. and pH 3.

[2]

A fuel cell separator comprising the titanium material or the titanium alloy material according to [1].

[3]

A polymer electrolyte fuel cell comprising the fuel cell separator according to [2].

Advantageous Effects of Invention

According to the present invention, it becomes possible to provide a titanium material or a titanium alloy material having good contact-to-carbon electrical conductivity and good durability and a fuel cell separator having excellent contact-to-carbon electrical conductivity and excellent durability. When the fuel cell separator is employed, the lifetime of the fuel cell can be greatly prolonged.

DESCRIPTION OF EMBODIMENTS

Figure 1:
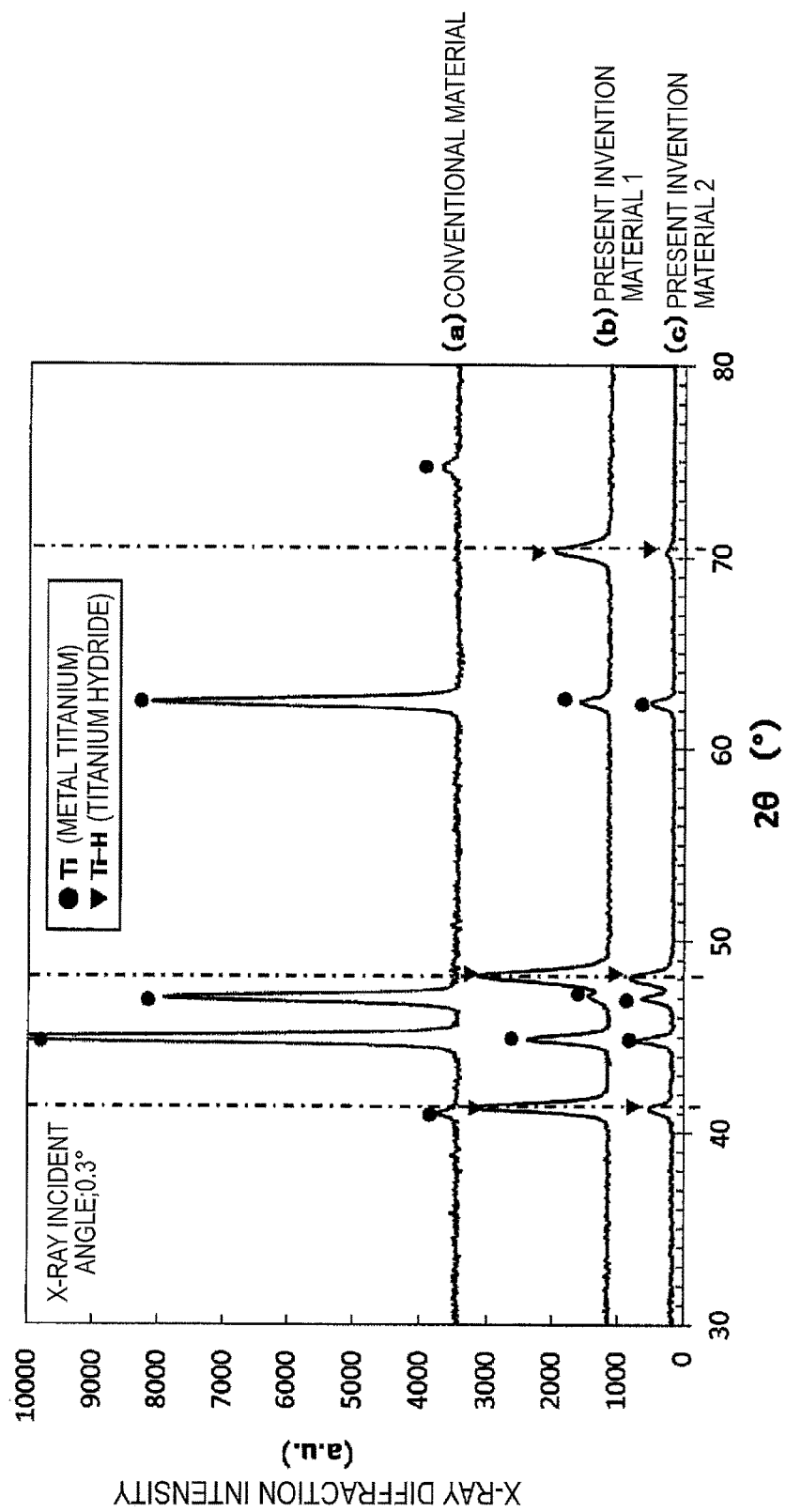
FIG. 1 is a diagram showing X-ray diffraction profiles (XRDs) of the surface of a titanium material or a titanium alloy material. (a) shows an XRD of the surface of a conventional material serving as a comparison (a surface after common pickling with nitrohydrofluoric acid), and (b) and (c) show XRDs of the surface of a titanium material or a titanium alloy material of the present invention (the present invention materials 1 and 2).

In The titanium material or a titanium alloy material of the present invention (hereinafter occasionally referred to as "the present invention material"), which can be suitable for a fuel cell separator having good contact-to-carbon electrical conductivity and good durability, the intensities of the X-ray diffraction peaks of the surface satisfy Formula (1) below, and a titanium oxide film is formed on the outermost surface. The composition ratio of a hydride $[I_{Ti-H}/(I_{Ti}+I_{Ti-H})] \times 100$ is preferably 60% or more. When the composition ratio of the hydride $[I_{Ti-H}/(I_{Ti}+I_{Ti-H})] \times 100$ is 60% or more, each of the amounts of increase in the contact resistance from before to after deterioration test 1 and deterioration test 2 described later is 4 mΩcm² or less.

$$[I_{Ti-H}/(I_{Ti}+I_{Ti-H})] \times 100 \geq 55\% \quad (1)$$

$I_{Ti-H}$: the maximum intensity of the X-ray diffraction peaks of the titanium hydride (TiH, TiH$_{1.5}$, TiH$_2$, or the like)

$I_{Ti}$: the maximum intensity of the X-ray diffraction peaks of metal Ti $I_{Ti-H}/(I_{Ti}+IT_{i-H})$ is an index that indicates the composition ratio between metal titanium and the titanium hydride at the surface of the titanium material or the titanium alloy material, and a larger value of the index means a phase configuration containing a larger amount of the titanium hydride.

The X-ray diffraction is performed by oblique incidence in which the incident angle of X-ray is fixed to a low angle, for example to 0.3°, with respect to the surface of the titanium material or the titanium alloy material. By the X-ray diffraction, the structure immediately below the surface can be identified.

In the present invention material, a titanium oxide film is formed on the outermost surface. By performing X-ray photoelectron spectroscopy on the surface of the titanium material or the titanium alloy material, a peak is detected in a Ti 2p spectrum at the position of the binding energy of TiO$_2$, which is a titanium oxide, i.e. approximately 459.2 eV. By the detection, the formation of the titanium oxide film can be confirmed.

The thickness of the titanium oxide is preferably 3 to 10 nm. The thickness of the titanium oxide film can be measured by, for example, observing a cross section immediately below the surface with a transmission electron microscope.

A method for producing the present invention material (hereinafter occasionally referred to as "the present invention material production method") is performed by performing the following on a titanium material or a titanium alloy material:

(i) forming a titanium hydride on the outer layer of the titanium material or the titanium alloy material, and then (ii) performing passivation treatment and stabilization treatment in prescribed aqueous solutions.

The treatment that forms a titanium hydride on the outer layer of the titanium material or the titanium alloy material (hereinafter occasionally referred to as "hydride formation treatment") is not particularly limited to a specific method. For example, (x) a method in which the titanium material or the titanium alloy material is immersed in hydrochloric acid or sulfuric acid, which is a non-oxidizing acid, (y) a method in which the titanium material or the titanium alloy material is cathodically electrolyzed, and (z) a method in which the titanium material or the titanium alloy material is subjected to heat treatment in a hydrogen-containing atmosphere are given. A titanium hydride can be formed on the outer layer of the titanium material or the titanium alloy material by any of these methods.

The aqueous solution used for the passivation treatment is an aqueous solution in which an oxidizing agent such as nitric acid or chromic acid is added. The prescribed aqueous solution used for the stabilization treatment is an aqueous solution containing rice flour, wheat flour, potato starch, corn flour, soybean flour, a pickling corrosion inhibitor, or the like, which is a naturally derived substance or an artificially synthesized substance containing one or more of an amine-based compound, an aminocarboxylic acid-based compound, a phospholipid, a starch, calcium ions, and polyethylene glycol, and also the aqueous solution used for the passivation treatment is an ordinary aqueous solution.

The present invention material is produced such that, in the titanium oxide film of the outermost surface and immediately below it, the amount of carbides, nitrides, carbonitrides, and/or borides of titanium is reduced within the extent of practical usability as a separator, in view of costs as well.

When at least one of C, N, and B is present as an unavoidably mixed-in element in the titanium base material, a carbide, a nitride, a carbonitride, and/or a boride of titanium may be formed during the heat treatment process. To suppress the formation of carbides, nitrides, carbonitrides, and/or borides of titanium to the extent possible, the total amount of C, N, and B contained in the titanium base material is preferably set to 0.1 mass % or less. It is more preferably 0.05 mass % or less.

In the present invention material, it is preferable that a titanium compound containing at least one of C, N, and B not be present in the titanium oxide film, and it is preferable that the amount of titanium compounds containing at least one of C, N, and B be reduced within the extent of practical usability as a separator since this causes a large cost increase. The effect of the present invention is exhibited when C is at 10 atomic % or less, N at 1 atomic % or less, and B at 1 atomic % or less as a result of an analysis of the surface using X-ray photoelectron spectroscopy (XPS) after the surface is subjected to sputtering of 5 nm with argon.

Here, the depth of argon sputtering is the value converted from the sputtering rate when the sputtering is performed on SiO$_2$. Since a peak is detected in a Ti 2p spectrum also from the surface after sputtering of 5 nm at the position of the binding energy of TiO$_2$, which is a titanium oxide, i.e. approximately 459.2 eV, the result is an analysis result of the interior of the titanium oxide film.

For the data analysis, MutiPak V. 8.0, an analysis software application produced by Ulvac-phi, Incorporated, was used.

It has been known that the contact resistance of the surface is a relatively small value in a state where oil components of cold rolling remain or in a state where a carbide, a nitride, and/or a carbonitride of titanium, which is an electrically conductive substance, is dispersed on the surface due to heating in a nitrogen gas atmosphere. However, in the state as it is, during the exposure to an acidic corrosion environment of the actual use, these titanium compounds are dissolved and re-precipitated as an oxide that inhibits the contact electrical conductivity, and reduce the contact electrical conductivity.

The present invention will now be described in more detail with reference to the drawings.

The present invention material can be obtained by, for example, forming a titanium hydride near the surface of a titanium base material by hydride formation treatment, then performing passivation treatment in an aqueous solution in which an oxidizing agent such as nitric acid or chromic acid is added, and performing stabilization treatment with a prescribed aqueous solution.

FIG. 1 shows X-ray diffraction profiles (XRDs) of the surface of a titanium material or a titanium alloy material for a fuel cell separator. In FIG. 1(a) shows an XRD of the surface of a conventional material serving as a comparison (a surface after common pickling with nitrohydrofluoric acid), and FIGS. 1(b) and 1(c) show XRDs of the surface of a titanium material or a titanium alloy material for a fuel cell separator of the present invention (the present invention material). In the present invention example 1 shown in (b), the composition ratio of the titanium hydride $[I_{Ti-H}/(I_{Ti}+I_{Ti-H})] \times 100$ is 63%, and in the present invention example 2 shown in (c), the composition ratio of the titanium hydride $[I_{Ti-H}/(I_{Ti}+I_{Ti-H})] \times 100$ is 55%.

For the X-ray diffraction peaks, in the conventional material of (a), only diffraction peaks of metal titanium (the circle marks in the drawing) are detected; on the other hand, in the present invention materials of (b) and (c), very strong peaks of a titanium hydride (the inverted triangle marks in the drawing) are detected. The titanium hydride is found to be $TiH_{1.5}$ from the positions of the diffraction peaks. Here, the element concentration distribution in the depth direction from the surface was measured by glow discharge optical emission spectrometry, and it has been found that hydrogen is concentrated in an outer layer portion.

Here, the method of the X-ray diffraction measurement and the method for identifying the diffraction peaks are described. The X-ray diffraction profile was measured by oblique incidence in which the incident angle of X-ray was fixed to 0.3° with respect to the surface of the titanium material or the titanium alloy material, and the diffraction peaks thereof were identified.

Using SmartLab, an X-ray diffraction apparatus manufactured by Rigaku Corporation, Co-Kα (wavelength: λ=1.7902 Å) was used for the target at an incident angle of 0.3°, and a W/Si multiple-layer film mirror (on the incident side) was used for the Kβ removal method. The X-ray source load power (tube voltage/tube current) is 9.0 kW (45 kV/200 mA). The analysis software application used is X'pert HighScore Plus produced by Spectris Co., Ltd.

The measured X-ray diffraction profile can be compared to a database in which a titanium hydride such as ICDD Card No. 01-078-2216, 98-002-1097, 01-072-6452, or 98-006-9970 is used as the reference material; thereby, the diffraction peaks can be identified.

The depth of X-ray entry in the measurement conditions mentioned above is approximately 0.18 µm for metal titanium and approximately 0.28 µm for the titanium hydride, and therefore the X-ray diffraction peaks are X-ray diffraction peaks that reflect the structure extending approximately 0.2 to 0.3 µm in depth from the surface.

Figure 2:
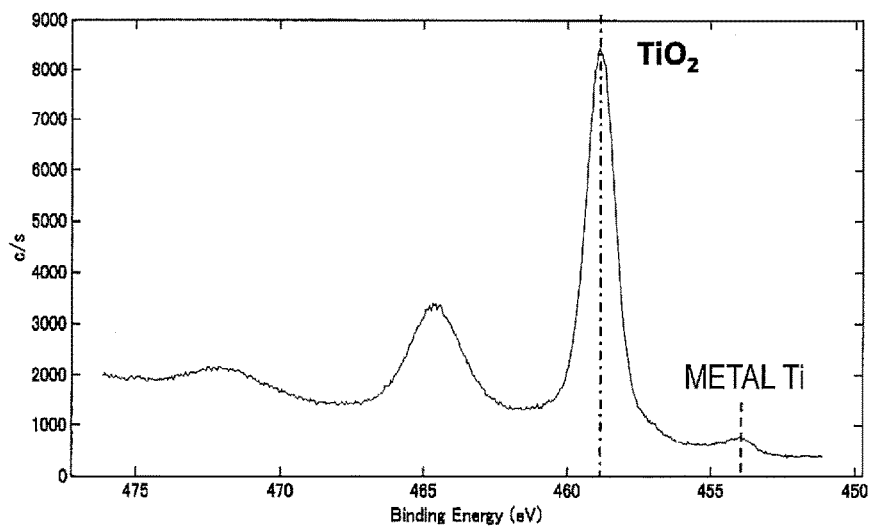
FIG. 2 is a diagram showing the results of X-ray photoelectron spectroscopy (XPS) of the surfaces of two titanium materials or titanium alloy materials of the present invention. (a) shows the result of X-ray photoelectron spectroscopy (XPS) of the surface of one titanium material or titanium alloy material, and (b) shows the result of X-ray photoelectron spectroscopy (XPS) of the surface of the other titanium material or titanium alloy material.
Figure 2:
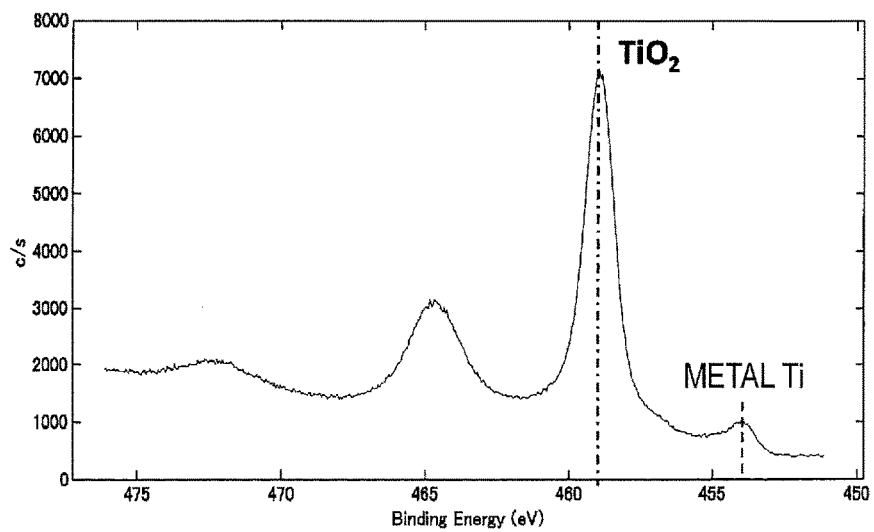
Figure 3:
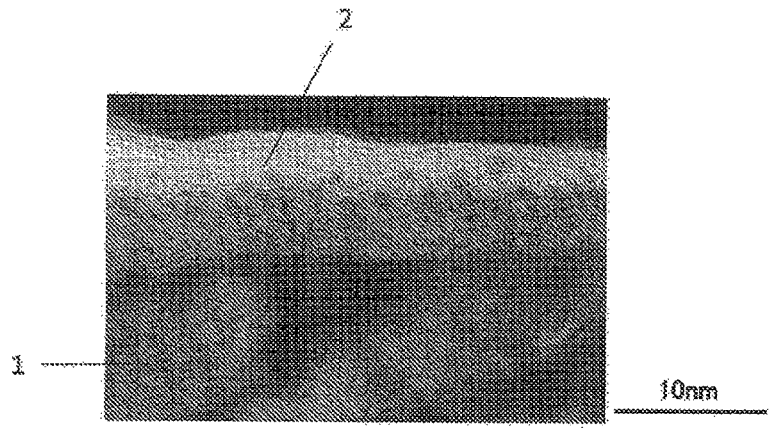
FIG. 3 is a diagram showing a transmission electron microscope image of a cross section immediately below the surface of a titanium material or a titanium alloy material of the present invention.

In FIG. 2, photoelectron spectra of Ti 2p measured by XPS of the outermost surface of the present invention material are shown. In FIG. 3, a transmission electron microscope image of a cross section immediately below the surface of the present invention material is shown. As shown in FIG. 2, a very strong peak is detected from the outermost surface at the position of the binding energy of $TiO_2$, which is a titanium oxide, i.e. approximately 459.2 eV.

In FIG. 3, a portion 2 in a bright (whitish) film form which covers Ti 1 is a titanium oxide film. Ti and O are detected from this portion by energy dispersive spectrometry (EDS), and it is found that a titanium oxide film is formed in this portion.

Also in the conventional material, when the titanium oxide film is subjected to a prescribed passivation treatment and stabilization treatment, the durability to a simple acidic environment is enhanced, but in a corrosion environment in which fluorine is contained or in a usage environment in which an electric potential is applied, there is a case where the durability cannot be maintained. This applies also to a titanium alloy in which a platinum group element, Au, or Ag is added. The impurity level of platinum group elements is less than 0.005 mass % and when the total amount of platinum group elements, Au, and Ag contained is less than 0.005 mass %, this case is regarded as a titanium alloy (titanium) in which a platinum group element, Au, or Ag is added.

In the conventional material, when the concentration of fluoride ions is 2 ppm or more, the contact resistance with carbon paper is increased to approximately 100 mΩ·cm² or more, and the amount of increase in the contact resistance is approximately 90 mΩ·cm² or more, but in the present invention material, the contact resistance with carbon paper is as low as 10 to 20 mΩ·cm² or less even when the concentration of fluoride ions is 2 to 5 ppm, and the amount of increase in the contact resistance can be suppressed to 10 mΩcm² or less at most, in a preferred case to 4 mΩcm² or less, and high tolerance is exhibited to fluorine.

Thus, in the present invention material, in deterioration test 1 in which immersion is performed at 80° C. for 4 days in a sulfuric acid aqueous solution adjusted to pH 3 and containing 2 ppm F ions, the amount of increase in the contact resistance with carbon paper after the deterioration test is 10 mΩcm² or less at a surface pressure of 10 kgf/cm². It is preferably 4 mΩcm² or less. For reference, the value of the contact resistance after deterioration test 1 is 20 mΩ·cm² or less, preferably 10 mΩ·cm² or less.

In deterioration test 2 in which an electric potential of 1.0 V (vs. SHE) is applied for 24 hours in a sulfuric acid aqueous solution at 80° C. and pH 3, the amount of increase in the contact resistance with carbon paper after the deterioration test is 10 mΩcm² or less at a surface pressure of 10 kgf/cm². It is preferably 4 mΩcm² or less. For reference, in the present invention material, the value of the contact resistance after deterioration test 2 is as low as 20 mΩ·cm² or less, preferably as low as 10 mΩ·cm² or less, and high tolerance can be maintained even when an electric potential is applied. On the other hand, in the conventional material, the value of the contact resistance is as high as approximately 30 mΩ·cm², and the amount of increase in the contact resistance is as high as approximately 20 mΩ·cm².

Each of deterioration tests 1 and 2 can measure the tolerance (the degree of stability) to fluorine and the applied voltage by means of the amount of increase in the contact resistance. As the test time whereby a significant difference can be identified sufficiently, 4 days and 24 hours are selected, respectively. In general, there is seen a tendency for the contact resistance to increase almost linearly with the test time, and when the value has become approximately 30 mΩ·cm² or more, increase rapidly thereafter.

In view of the fact that the contact resistance varies depending on the carbon paper used, the contact resistance measured using TGP-H-120 produced by Toray Industries, Inc. was taken as the standard in the deterioration test.

The present inventors have thought up the idea that the contact resistance of the present invention material being stable at a lower level than existing contact resistances is caused by the titanium hydride formed on the outer layer. With focus on the X-ray diffraction peaks from the titanium hydride shown in FIG. 1, the present inventors made extensive studies on the correlation between the X-ray diffraction intensity of metal titanium (Ti) and the X-ray diffraction intensity from the titanium hydride (Ti—H).

Figure 4:
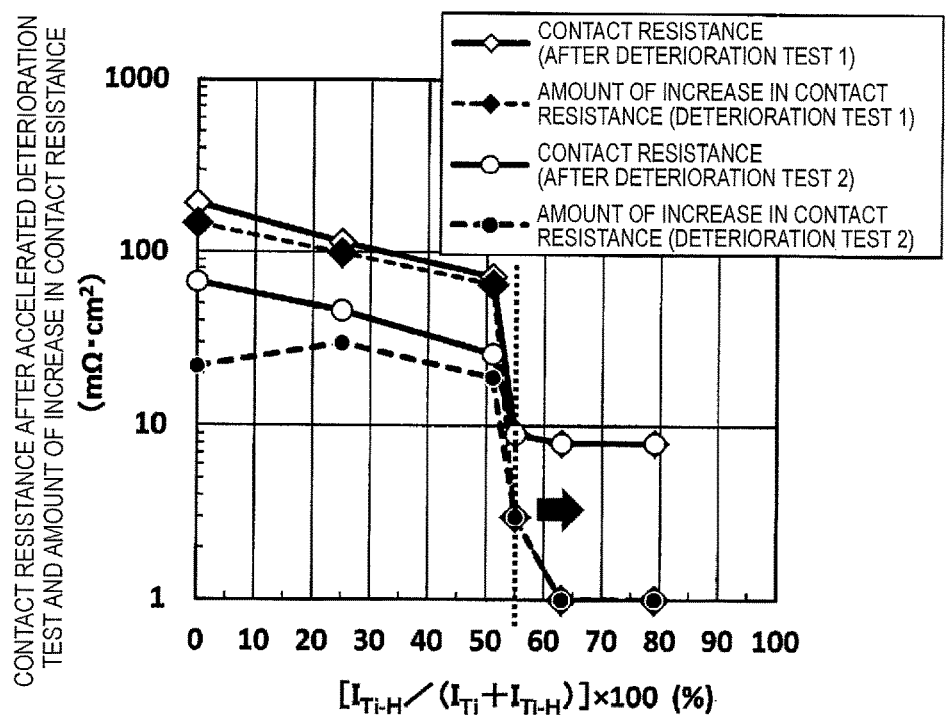
FIG. 4 is a diagram showing the relationships between the value of $[I_{Ti-H}/(I_{Ti}+I_{Ti-H})] \times 100$ (Formula (1)) found from the result of X-ray diffraction measured at the surface of a titanium material or a titanium alloy material, the contact resistance with carbon paper after a deterioration test of the material, and the amount of increase in the contact resistance from before to after the deterioration test. Both deterioration tests 1 and 2 mentioned above are shown.

The results are shown in FIG. 4. The $[I_{Ti-H}/(I_{Ti}+I_{Ti-H})] \times 100$ on the horizontal axis was found from the result of identification of the diffraction peaks in the X-ray diffraction profile measured by oblique incidence in which the incident angle of X-ray was fixed to 0.3° with respect to the surface of the titanium or the titanium alloy material.

$[I_{Ti-H}/(I_{Ti}+I_{Ti-H})] \times 100$ is an index of the composition ratio between metal titanium and the titanium hydride at the surface of the titanium or the titanium alloy material, and quantitatively indicates that a larger value of the index corresponds to a phase configuration containing a larger amount of the titanium hydride. The vertical axis represents the contact resistance measured by performing deterioration tests 1 and 2 and the amount of increase in the contact resistance. In each case, stabilization treatment was performed after passivation treatment was performed, in prescribed aqueous solutions. After that, deterioration test 1 described above (immersion at 80° C. for 4 days in a sulfuric acid aqueous solution at pH 3 with a fluoride ion concentration of 2 ppm) and deterioration test 2 described above (application of an electric potential of 1.0 V (vs. SHE) for 24 hours in a sulfuric acid aqueous solution at pH 3) were performed. The (vs. SHE) represents the value with respect to the standard hydrogen electrode (SHE).

As shown in FIG. 4, the contact resistance after deterioration tests 1 and 2 is very low when $[I_{Ti-H}/(I_{Ti}+I_{Ti-H})] \times 100$ is 55% or more. The present inventors have found that, in the present invention material, the correlation of Formula (1) mentioned above exists between the X-ray diffraction intensity of metal titanium (Ti) and the X-ray diffraction intensity from the titanium hydride (Ti—H).

Thus, in the present invention material, $[I_{Ti-H}/(I_{Ti}+I_{Ti-H})] \times 100$ is set to 55% or more. It is preferably set to 60% or more, where the contact resistance after the accelerated deterioration test (after deterioration tests 1 and 2) is stable at a low level as shown in FIG. 4. The upper limit thereof is 100% or less as a matter of course. The contact resistance of the objective of the present invention material has been obtained also when, in view of the fact that embrittlement due to the titanium hydride is a concern, bending-back processing was performed on a material with an $[I_{Ti-H}/(I_{Ti}+I_{Ti-H})] \times 100$ of 85% which had been subjected to hydride formation treatment with hydrochloric acid.

As the action of the titanium hydride, an action in which, when the titanium oxide film of the outermost surface is attacked by fluoride ions in the pickling environment, the hydrogen in the titanium promotes the repair of the damaged oxide film by virtue of the easy diffusibility of the hydrogen, an action in which the titanium oxide film of the outermost surface is ennobled by contacting the titanium hydride, an action in which, although dissolved-out titanium ions precipitate as a titanium oxide on the surface and usually increase the contact resistance, the working of the hydrogen of the titanium hydride prevents the progress of oxidation and forms a precipitate having electrical conductivity, etc. are presumed. From such actions, it is presumed that, when a film structure provided by the present application is included, the effect is sufficiently obtained regardless of whether a platinum group element, Au, or Ag is contained or not.

In any of the actions, to exhibit the effect thereof, it is necessary that a prescribed amount or more of the titanium hydride be present as shown FIG. 4.

After the hydride formation treatment, the present invention material is subjected to passivation treatment and stabilization treatment in prescribed aqueous solutions. By the treatments, a titanium oxide film is formed on the outermost surface as shown in FIG. 2 and FIG. 3. The thickness of the titanium oxide film is preferably 3 to 10 nm from the viewpoints of suppressing the initial contact resistance to a low level and ensuring durability to fluorine and voltage application in the environment to which the present invention material is exposed.

If the thickness of the titanium oxide film is less than 3 nm, the contact resistance after the deterioration test in which fluorine is added or a voltage is applied will be more than 20 mΩ·cm² and also the amount of increase in the contact resistance will be more than 10 mΩ·cm², and the durability will be insufficient. On the other hand, if the thickness of the titanium oxide film is more than 10 nm, the initial contact resistance may be more than 10 mΩ·cm².

The thickness of the titanium oxide film of the outermost surface can be measured by observing a cross section immediately below the surface with a transmission electron microscope. In FIG. 3, the portion 2 in a bright (whitish) film form is the titanium oxide film.

The conditions of the passivation treatment performed in a prescribed aqueous solution and the conditions of the subsequent stabilization treatment are as follows.

The aqueous solution used for the passivation treatment is an aqueous solution containing an oxidizing agent such as nitric acid or chromic acid. It is presumed that the titanium oxide film is densified by the oxidizing power of them.

The aqueous solution used for the stabilization treatment is an aqueous solution containing rice flour, wheat flour, potato starch, corn flour, soybean flour, a pickling corrosion inhibitor, or the like, which is a naturally derived substance or an artificially synthesized substance containing one or more of an amine-based compound, an aminocarboxylic acid-based compound, a phospholipid, a starch, calcium ions, and polyethylene glycol, and exhibits the effect of suppressing the attack from acid components, halide ions (chloride, fluoride, and the like), etc. present in the exposure environment.

In the conventional material, even in a titanium oxide film formed by performing passivation treatment and stabilization treatment in aqueous solutions, a carbide, a nitride, and/or a carbonitride of titanium present in a large amount in or immediately below the titanium oxide film is dissolved out in a corrosion environment in which fluorine is contained or in a usage environment in which an electric potential is applied, and is re-precipitated as an oxide that inhibits the contact electrical conductivity.

On the other hand, in the present invention material, a carbide, a nitride, and/or a carbonitride of titanium produced on the surface by bright annealing can be almost removed by removing oil components containing C etc., which cause carbide formation, with pickling cold rolling as pre-treatment after the cold rolling or by performing pickling with nitrohydrofluoric acid or hydride formation treatment after the bright annealing.

As described above, the effect of the present invention has been exhibited when C is at 10 atomic % or less, N at 1 atomic % or less, and B at 1 atomic % or less as a result of an analysis of the surface using X-ray photoelectron spectroscopy (XPS) after the surface is subjected to sputtering of 5 nm with argon.

After that, passivation treatment and stabilization treatment are performed in prescribed aqueous solutions; thus, a surface structure, in which the amount of carbides, nitrides, and/or carbonitrides of titanium that are likely to dissolve out is reduced within the extent of practical usability as a separator, in view of costs as well, is formed. By the surface structure, the durability in a corrosion environment in which fluorine is contained or in a usage environment in which an electric potential is applied is significantly improved.

In the case where neither passivation treatment nor stabilization treatment in a prescribed aqueous solution is performed, although the initial contact resistance is low, the contact resistance is increased to approximately 30 mΩ·cm$^2$ or more after the accelerated deterioration test.

Thus, in the present invention material, the contact resistance after the accelerated deterioration test is 20 mΩ·cm$^2$ or less. It is preferably 10 mΩ·cm$^2$ or less. It is more preferably 8 mΩ·cm$^2$ or less.

Next, an example of the method for producing the present invention material is described.

In producing a piece of foil serving as a titanium base material, in order to make it less likely for a carbide, a nitride, and/or a carbonitride of titanium to be produced on the surface, the component design described above is implemented, and the conditions of cold rolling, cleaning (including pickling), and annealing (atmosphere, temperature, time, etc.) are selected and these processes are performed. As necessary, subsequently to annealing, pickling cleaning is performed with a nitrohydrofluoric acid aqueous solution (e.g. 3.5 mass % hydrogen fluoride+4.5 mass % nitric acid).

After that, the titanium base material is subjected to any one of the treatments of (x) immersion in hydrochloric acid or sulfuric acid, which is a non-oxidizing acid, (y) cathodic electrolysis, and (z) heat treatment in a hydrogen-containing atmosphere; thus, a titanium hydride (TiH, TiH$_{1.5}$, or TiH$_2$) is formed on the outer layer of the titanium or the titanium alloy material.

If a large amount of the hydride is formed up to the interior of the titanium base material, the entire base material may be embrittled; thus, the method of (x) immersion in hydrochloric acid or sulfuric acid, which is a non-oxidizing acid, in which method hydrogen can be concentrated only relatively near the surface, is preferable.

Subsequently, passivation treatment is performed on the outer layer on which the titanium hydride is formed. The passivation treatment is performed by, for example, immersing the titanium base material for a prescribed time in a mixed aqueous solution that is at a prescribed temperature and contains nitric acid or chromic anhydride, such as an aqueous solution containing 30 mass % nitric acid or a mixed aqueous solution containing 25 mass % chromic anhydride and 50 mass % sulfuric acid. By the passivation treatment, a stable passivated titanium oxide film is formed on the outermost surface of the titanium base material; thus, corrosion is suppressed.

The temperature of the aqueous solution mentioned above is preferably 50° C. or more in order to improve the productivity. It is more preferably 60° C. or more, still more preferably 85° C. or more. The upper limit of the temperature is preferably 120° C. The immersion time is, depending on the temperature of the aqueous solution, generally 0.5 to 1 minute or more. It is preferably 1 minute or more. The upper limit of the immersion time is preferably 45 minutes, more preferably approximately 30 minutes.

After the passivation treatment is performed, in order to stabilize the titanium oxide film, stabilization treatment is performed for a prescribed time using a stabilization treatment liquid at a prescribed temperature.

The stabilization treatment liquid is an aqueous solution containing rice flour, wheat flour, potato starch, corn flour, soybean flour, a pickling corrosion inhibitor, or the like, which is a naturally derived substance or an artificially synthesized substance containing one or more of an amine-based compound, an aminocarboxylic acid-based compound, a phospholipid, a starch, calcium ions, and polyethylene glycol.

For example, an aqueous solution containing a pickling corrosion inhibitor [HIBIRON (Registered Trademark No. 4787376) AS-25C, produced by Sugimura Chemical Industrial Co., Ltd.] may be used. The stabilization treatment is preferably performed for 1 to 10 minutes using a stabilization treatment liquid at 45 to 100° C.

The present invention material has excellent electrical conductivity and excellent durability as described above, and is very useful as a base material for a separator for a fuel cell.

The fuel cell separator using the present invention material as the base material effectively uses the surface of the present invention material as it is, as a matter of course.

Also a case where a noble metal-based metal such as gold, carbon, or a carbon-containing electrically conductive film is further formed on the surface of the present invention material may be possible. In this case, in a fuel cell separator using the present invention material as the base material, even when there is a defect in the noble metal-based metal such as gold, the carbon film, or the carbon-containing film, the corrosion of the titanium base material is more suppressed than in conventional ones because the surface having excellent contact electrical conductivity and excellent corrosion resistance of the present invention material is present immediately below the film.

In the fuel cell separator using the present invention material as the base material, the surface has contact electrical conductivity and durability at the same level as those of the conventional carbon separator, and furthermore is less likely to crack; thus, the quality and lifetime of the fuel cell can be ensured over a long period of time.

EXAMPLES

Next, Examples of the present invention are described, but the conditions in Examples are only condition examples employed to assess the feasibility and effect of the present invention, and the present invention is not limited to these condition examples. The present invention may employ various conditions to the extent that they do not depart from the spirit of the present invention and they achieve the object of the present invention.

Example 1

To assess the surface conditions and contact characteristics of the present invention intermediate material and the present invention alloy material, test materials were prepared while various conditions of the titanium or the titanium alloy material (hereinafter referred to as a "titanium base material"), the pre-treatment, the hydrogen treatment (the hydride formation treatment), the passivation treatment, and the stabilization treatment were changed, and the surface conditions of the titanium base material were investigated by X-ray diffraction and the contact electrical conductivity was measured by accelerated deterioration tests. The transmission electron microscope investigation image is as shown in FIG. 3. The measurement results are shown in Tables 1 to 7 together with the various conditions.

[Titanium Base Material]

The titanium base material (material) is as follows.

M01: a titanium (JIS H 4600 type 1 TP270C); an industrial pure titanium, type 1

M02: a titanium (JIS H 4600 type 3 TP480C); an industrial pure titanium, type 2

M03: a titanium alloy (JIS H 4600 type 61); Al (2.5 to 3.5 mass %)-V (2 to 3 mass %)-Ti M04: a titanium alloy (JIS H 4600 type 16); Ta (4 to 6 mass %)-Ti M05: a titanium alloy (JIS H 4600 type 17); Pd (0.04 to 0.08 mass %)-Ti M06: a titanium alloy (JIS H 4600 type 19); Pd (0.04 to 0.08 mass %)-Co (0.2 to 0.8 mass %)-Ti M07: a titanium alloy (JIS H 4600 type 21); Ru (0.04 to 0.06 mass %)-Ni (0.4 to 0.6 mass %)-Ti M08: a titanium alloy; Pd (0.02 mass %)-Mm (0.002 mass %)-Ti Here, Mm is mixed rare-earth elements before isolation and purification (misch metal), and the composition of the Mm used is 55 mass % Ce, 31 mass % La, 10 mass % Nd, and 4 mass % Pr.

M09: a titanium alloy; Pd (0.03 mass %)-Y (0.002 mass %)-Ti

M10: a titanium alloy (JIS H 4600 type 11); Pd (0.12 to 0.25 mass %)-Ti

Note: M08 and M09, which are a titanium alloy other than those in JIS standards, refer to a base material obtained by performing smelting on a laboratory scale and performing hot rolling and cold rolling.

[Pre-Treatment]

The pre-treatment of the titanium base material is as follows.

P01: perform cold rolling up to a thickness of 0.1 mm, perform alkaline cleaning, then perform bright annealing at 800° C. for 20 seconds in an Ar atmosphere, and then clean the surface by pickling with nitrohydrofluoric acid P02: perform cold rolling up to a thickness of 0.1 mm, perform cleaning by pickling with nitrohydrofluoric acid to remove the rolling oil, and then perform bright annealing at 800° C. for 20 seconds in an Ar atmosphere P03: perform cold rolling up to a thickness of 0.1 mm, perform alkaline cleaning, and then perform bright annealing at 800° C. for 20 seconds in an Ar atmosphere In the surface cleaning with nitrohydrofluoric acid of P01 and P02, immersion was performed at 45° C. for 1 minute in an aqueous solution containing 3.5 mass % hydrogen fluoride (HF) and 4.5 mass % nitric acid ($HNO_3$). The portion extending approximately 5 μm in depth from the surface was dissolved.

[Hydride Formation Treatment]

(x) Pickling

H01: a 30 mass % hydrochloric acid aqueous solution

H02: a 30 mass % sulfuric acid aqueous solution (y) Cathodic Electrolysis Treatment H03: a pH 1 sulfuric acid aqueous solution; current density: 1 mA/cm$^2$ (z) Heat Treatment in a Hydrogen-Containing Atmosphere H04: an atmosphere (450° C.) of 20% hydrogen+80% Ar gas

[Passivation Treatment]

The aqueous solution used for the passivation treatment is as follows.

A01: an aqueous solution containing 30 mass % nitric acid

A02: an aqueous solution containing 20 mass % nitric acid

A03: an aqueous solution containing 10 mass % nitric acid

A04: an aqueous solution containing 5 mass % nitric acid

A05: a mixed aqueous solution containing 25 mass % chromic anhydride and 50 mass % sulfuric acid A06: a mixed aqueous solution containing 15 mass % chromic anhydride and 50 mass % sulfuric acid A07: a mixed aqueous solution containing 15 mass % chromic anhydride and 70 mass % sulfuric acid A08: a mixed aqueous solution containing 5 mass % chromic anhydride and 50 mass % sulfuric acid A09: a mixed aqueous solution containing 5 mass % chromic anhydride and 70 mass % sulfuric acid Note: In each case, when a solid content occurred, the state of being dispersed in the liquid was used as it was.

Note: The temperature of the aqueous solution was changed in the range of 40 to 120° C., and the immersion treatment time was changed in the range of 0.5 to 25 minutes.

[Stabilization Treatment]

The aqueous solution used for the stabilization treatment is as follows.

B01: 0.25 mass % rice flour, the rest being ion-exchanged water

B02: 0.25 mass % wheat flour, the rest being ion-exchanged water

B03: 0.25 mass % potato starch, the rest being ion-exchanged water

B04: 0.25 mass % corn flour, the rest being ion-exchanged water

B05: 0.25 mass % soybean flour, the rest being ion-exchanged water

B06: 0.02 mass % polyethylene glycol, 0.05 mass % rice flour, 0.0001 mass % calcium carbonate, 0.0001 mass % calcium hydroxide, and 0.0001 mass % calcium oxide, the rest being distilled water B07: 0.10 mass % of a pickling corrosion inhibitor [HIBIRON (Registered Trademark No. 4787376) AS-20K, produced by Sugimura Chemical Industrial Co., Ltd.], the rest being ion-exchanged water B08: 0.05 mass % of a pickling corrosion inhibitor [HIBIRON (Registered Trademark No. 4787376) AS-35N, produced by Sugimura Chemical Industrial Co., Ltd.], the rest being ion-exchanged water B09: 0.08 mass % of a pickling corrosion inhibitor [HIBIRON (Registered Trademark No. 4787376) AS-25C, produced by Sugimura Chemical Industrial Co., Ltd.], the rest being tap water B10: 0.10 mass % of a pickling corrosion inhibitor [HIBIRON (Registered Trademark No. 4787376) AS-561, produced by Sugimura Chemical Industrial Co., Ltd.], the rest being tap water B11: 0.30 mass % of a pickling corrosion inhibitor [HIBIRON (Registered Trademark No. 4787376) AS-561, produced by Sugimura Chemical Industrial Co., Ltd.], the rest being tap water B12: 0.01 mass % of a pickling corrosion inhibitor [KILESBIT (Registered Trademark No. 4305166) 17C-2, produced by Chelest Corporation], the rest being well water B13: 0.04 mass % of a pickling corrosion inhibitor (IBIT (Registered Trademark No. 2686586) New Hyper DS-1, produced by Asahi Chemical Co., Ltd.), the rest being industrial water Note: In each case, when a solid content occurred, the state of being dispersed in the liquid was used as it was.

Note: The temperature of the aqueous solution was changed in the range of 45 to 100° C., and the immersion treatment time was changed in the range of 1 to 10 minutes.

[Deterioration Test]

Deterioration test 1 is performed by immersion for 4 days in a sulfuric acid solution at 80° C. and pH 3 containing 2 ppm F ions.

Deterioration test 2 is performed by application of an electric potential of 1.0 V (vs. SHE) for 24 hours in a sulfuric acid solution at 80° C. and pH 3.

[Evaluative Determination]

In the amount of increase in the contact resistance, "A" refers to 4 mΩcm$^2$ or less, "B" to more than 4 mΩcm$^2$ and not more than 10 mΩcm$^2$, and "C" to more than 10 mΩcm$^2$. The value of the contact resistance measured using the conditions described above was 10 mΩcm$^2$ or less in the case of "A" more than 10 and not more than 20 mΩcm$^2$ in the case of "B" and more than 20 mΩcm$^2$ in the case of "C".

A test piece of a prescribed size was taken from the test material that was prepared while the conditions mentioned above were changed, and the features of the surface were measured and Deterioration tests 1 and 2 were performed to measure the contact electrical conductivity. The measurement results are shown in Tables 1 to 7 together with the various conditions. For the concentrations of C, N, and B (results of XPS) out of the features of the surface in Tables, "A is the case where, through an analysis of the surface using X-ray photoelectron spectroscopy (XPS) after the surface is subjected to sputtering of 5 nm with argon, it is found that C is at 10 atomic % or less, N at 1 atomic % or less, and B at 1 atomic % or less, and "B" is the case where, through the analysis mentioned above, it is found that any one of these elements is more than the corresponding concentration mentioned above.

The results when the conditions of the titanium base material and the pre-treatment were changed are shown in Table 1.

TABLE 1

| | | Implementation No. | | | | | |
|---|---|---|---|---|---|---|---|
| | | 1-1 Comparative Example | 1-2 Comparative Example | 1-3 Comparative Example | 1-4 Present Invention Example | 1-5 Present Invention Example | 1-6 Present Invention Example |
| | Summary | | | | | | |
| Material | Base material | M01 | M01 | M01 | M01 | M01 | M02 |
| Treatment method | Pre-treatment | P01 | P02 | P03 | P02 | P02 | P01 |
| | Hydride formation treatment | — | — | — | H01 | H01 | H01 |
| | Treatment temperature (° C.) | — | — | — | 70 | 70 | 70 |
| | Treatment time (min) | — | — | — | 15 | 25 | 15 |
| | Passivation treatment | — | — | — | A01 | A01 | A01 |
| | Treatment temperature (° C.) | — | — | — | 90 | 90 | 90 |
| | Treatment time (min) | — | — | — | 10 | 10 | 10 |
| | Stabilization treatment | — | — | — | B09 | B09 | B09 |
| | Treatment temperature (° C.) | — | — | — | 100 | 100 | 100 |
| | Treatment time (min) | — | — | — | 5 | 5 | 5 |
| Properties of surface | $[I_{Ti-H}/(I_{Ti} + I_{T-H})] \times 100$ (%) | 0 (—) | 0 (—) | 0 (—) | 64 | 76 | 62 |
| | Thickness of titanium oxide coating film (nm) | 5 | 6 | 5 | 6 | 7 | 7 |
| | Concentration of C, N, and B (result of XPS) | A | A | B | A | A | A |
| Contact electrical conductivity | Before deterioration test (mΩ · cm$^2$) | 40 | 53 | 15 | 6 | 6 | 6 |
| | After deterioration test (mΩ · cm$^2$) | 1000 | 1000 | 1000 | 8 | 7 | 7 |
| Deterioration test 1 | Evaluative determination | C | C | C | A | A | A |
| Contact electrical conductivity | Before deterioration test (mΩ · cm$^2$) | 40 | 53 | 15 | 6 | 6 | 6 |
| | After deterioration test (mΩ · cm$^2$) | 1000 | 1000 | 1000 | 7 | 7 | 7 |
| Deterioration test 2 | Evaluative determination | C | C | C | A | A | A |

| | | Implementation No. | | | | | |
|---|---|---|---|---|---|---|---|
| | | 1-7 Present Invention Example | 1-8 Present Invention Example | 1-9 Present Invention Example | 1-10 Present Invention Example | 1-11 Present Invention Example | 1-12 Present Invention Example |
| | Summary | | | | | | |
| Material | Base material | M02 | M02 | M03 | M04 | M05 | M06 |
| Treatment method | Pre-treatment | P01 | P02 | P01 | P01 | P01 | P01 |
| | Hydride formation treatment | H01 | H01 | H01 | H01 | H01 | H01 |
| | Treatment temperature (° C.) | 70 | 70 | 70 | 70 | 70 | 70 |
| | Treatment time (min) | 25 | 25 | 25 | 25 | 25 | 25 |
| | Passivation treatment | A01 | A01 | A01 | A01 | A01 | A01 |
| | Treatment temperature (° C.) | 90 | 90 | 90 | 90 | 90 | 90 |
| | Treatment time (min) | 10 | 10 | 10 | 10 | 10 | 10 |

TABLE 1-continued

|  |  | | | | | | |
|---|---|---|---|---|---|---|---|
|  | Stabilization treatment | B09 | B09 | B09 | B09 | B09 | B09 |
|  | Treatment temperature (° C.) | 100 | 100 | 100 | 100 | 100 | 100 |
|  | Treatment time (min) | 5 | 5 | 5 | 5 | 5 | 5 |
| Properties of surface | $[I_{Ti-H}/(I_{Ti} + I_{T-H})] \times 100$ (%) | 80 | 72 | 71 | 71 | 74 | 73 |
|  | Thickness of titanium oxide coating film (nm) | 7 | 5 | 6 | 6 | 7 | 6 |
|  | Concentration of C, N, and B (result of XPS) | A | A | A | A | A | A |
| Contact electrical conductivity | Before deterioration test ($m\Omega \cdot cm^2$) | 6 | 7 | 7 | 5 | 6 | 6 |
| Deterioration test 1 | After deterioration test ($m\Omega \cdot cm^2$) | 7 | 8 | 8 | 8 | 8 | 8 |
|  | Evaluative determination | A | A | A | A | A | A |
| Contact electrical conductivity | Before deterioration test ($m\Omega \cdot cm^2$) | 6 | 7 | 7 | 5 | 6 | 6 |
| Deterioration test 2 | After deterioration test ($m\Omega \cdot cm^2$) | 7 | 8 | 8 | 7 | 8 | 7 |
|  | Evaluative determination | A | A | A | A | A | A |

| | | Implementation No. | | | | | |
|---|---|---|---|---|---|---|---|
| | Summary | 1-13 Present Invention Example | 1-14 Present Invention Example | 1-15 Present Invention Example | 1-16 Present Invention Example | 1-17 Comparative Example | 1-18 Comparative Example |
| Material | Base material | M07 | M08 | M09 | M10 | M04 | M05 |
| Treatment method | Pre-treatment | P01 | P01 | P01 | P01 | P01 | P01 |
|  | Hydride formation treatment | H01 | H01 | H01 | H01 | H01 | H01 |
|  | Treatment temperature (° C.) | 70 | 70 | 70 | 70 | 70 | 70 |
|  | Treatment time (min) | 25 | 25 | 25 | 25 | 25 | 25 |
|  | Passivation treatment | A01 | A01 | A01 | A01 | — | — |
|  | Treatment temperature (° C.) | 90 | 90 | 90 | 90 | — | — |
|  | Treatment time (min) | 10 | 10 | 10 | 10 | — | — |
|  | Stabilization treatment | B09 | B09 | B09 | B09 | — | — |
|  | Treatment temperature (° C.) | 100 | 100 | 100 | 100 | — | — |
|  | Treatment time (min) | 5 | 5 | 5 | 5 | — | — |
| Properties of surface | $[I_{Ti-H}/(I_{Ti} + I_{T-H})] \times 100$ (%) | 77 | 78 | 73 | 74 | 75 | 74 |
|  | Thickness of titanium oxide coating film (nm) | 6 | 5 | 5 | 8 | 6 | 6 |
|  | Concentration of C, N, and B (result of XPS) | A | A | A | A | A | A |
| Contact electrical conductivity Deterioration test 1 | Before deterioration test ($m\Omega \cdot cm^2$) | 6 | 5 | 6 | 6 | 7 | 7 |
|  | After deterioration test ($m\Omega \cdot cm^2$) | 8 | 8 | 8 | 7 | 23 | 24 |
|  | Evaluative determination | A | A | A | A | C | C |
| Contact electrical conductivity Deterioration test 2 | Before deterioration test ($m\Omega \cdot cm^2$) | 6 | 5 | 6 | 6 | 7 | 7 |
|  | After deterioration test ($m\Omega \cdot cm^2$) | 8 | 7 | 8 | 7 | 31 | 30 |
|  | Evaluative determination | A | A | A | A | C | C |

| | | Implementation No. | | | | |
|---|---|---|---|---|---|---|
| | Summary | 1-19 Comparative Example | 1-20 Comparative Example | 1-21 Comparative Example | 1-22 Comparative Example | 1-23 Comparative Example |
| Material | Base material | M06 | M07 | M08 | M09 | M10 |
| Treatment method | Pre-treatment | P01 | P01 | P01 | P01 | P01 |
|  | Hydride formation treatment | H01 | H01 | H01 | H01 | H01 |
|  | Treatment temperature (° C.) | 70 | 70 | 70 | 70 | 70 |
|  | Treatment time (min) | 25 | 25 | 25 | 25 | 25 |
|  | Passivation treatment | — | — | — | — | — |
|  | Treatment temperature (° C.) | — | — | — | — | — |
|  | Treatment time (min) | — | — | — | — | — |
|  | Stabilization treatment | — | — | — | — | — |
|  | Treatment temperature (° C.) | — | — | — | — | — |
|  | Treatment time (min) | — | — | — | — | — |
| Properties of surface | $[I_{Ti-H}/(I_{Ti} + I_{T-H})] \times 100$ (%) | 73 | 75 | 73 | 74 | 74 |
|  | Thickness of titanium oxide coating film (nm) | 6 | 7 | 7 | 6 | 7 |
|  | Concentration of C, N, and B (result of XPS) | A | A | A | A | A |
| Contact electrical conductivity Deterioration test 1 | Before deterioration test ($m\Omega \cdot cm^2$) | 6 | 7 | 6 | 7 | 6 |
|  | After deterioration test ($m\Omega \cdot cm^2$) | 24 | 25 | 23 | 23 | 22 |
|  | Evaluative determination | C | C | C | C | C |
| Contact electrical conductivity Deterioration test 2 | Before deterioration test ($m\Omega \cdot cm^2$) | 6 | 7 | 6 | 7 | 6 |
|  | After deterioration test ($m\Omega \cdot cm^2$) | 31 | 33 | 31 | 30 | 27 |
|  | Evaluative determination | C | C | C | C | C |

The results when the treatment method, the treatment time, and the treatment temperature were varied in the hydride formation treatment are shown in Table 2.

TABLE 2

| | | Implementation No. | | | | | | |
|---|---|---|---|---|---|---|---|---|
| | | 2-1 Comparative Example | 2-2 Comparative Example | 2-3 Comparative Example | 2-4 Comparative Example | 2-5 Present Invention Example | 2-6 Present Invention Example | 2-7 Present Invention Example |
| | Summary | | | | | | | |
| Material | Base material | M01 | M01 | M01 | M01 | M01 | M01 | M01 |
| Treatment method | Pre-treatment | P03 | P01 | P01 | P01 | P01 | P01 | P01 |
| | Hydride formation treatment | — | — | H01 | H01 | H01 | H01 | H01 |
| | Treatment temperature (° C.) | — | — | 70 | 70 | 70 | 70 | 70 |
| | Treatment time (min) | — | — | 5 | 10 | 15 | 20 | 25 |
| | Passivation treatment | A01 | A01 | A01 | A01 | A01 | A01 | A01 |
| | Treatment temperature (° C.) | 90 | 90 | 90 | 90 | 90 | 90 | 90 |
| | Treatment time (min) | 10 | 10 | 10 | 10 | 10 | 10 | 10 |
| | Stabilization treatment | B09 | B09 | B09 | B09 | B09 | B09 | B09 |
| | Treatment temperature (° C.) | 100 | 100 | 100 | 100 | 100 | 100 | 100 |
| | Treatment time (min) | 5 | 5 | 5 | 5 | 5 | 5 | 5 |
| Properties of surface | $[I_{Ti-H}/(I_{Ti} + I_{T-H})] \times 100$ (%) | 0 (—) | 0 (—) | 25 (—) | 51 (—) | 55 | 63 | 79 |
| | Thickness of titanium oxide coating film (nm) | 6 | 6 | 7 | 6 | 6 | 7 | 7 |
| | Concentration of C, N, and B (result of XPS) | B | A | A | A | A | A | A |
| Contact electrical conductivity Deterioration test 1 | Before deterioration test (mΩ · cm²) | 5 | 45 | 6 | 7 | 6 | 7 | 7 |
| | After deterioration test (mΩ · cm²) | 113 | 192 | 115 | 72 | 9 | 8 | 8 |
| | Evaluative determination | C | C | C | C | A | A | A |
| Contact electrical conductivity Deterioration test 2 | Before deterioration test (mΩ · cm²) | 5 | 45 | 16 | 7 | 6 | 7 | 7 |
| | After deterioration test (mΩ · cm²) | 31 | 67 | 46 | 26 | 9 | 8 | 8 |
| | Evaluative determination | C | C | C | C | A | A | A |

| | | Implementation No. | | | | | |
|---|---|---|---|---|---|---|---|
| | | 2-8 Present Invention Example | 2-9 Present Invention Example | 2-10 Present Invention Example | 2-11 Present Invention Example | 2-12 Present Invention Example | 2-13 Present Invention Example |
| | Summary | | | | | | |
| Material | Base material | M01 | M01 | M01 | M01 | M01 | M01 |
| Treatment method | Pre-treatment | P01 | P01 | P01 | P01 | P01 | P01 |
| | Hydride formation treatment | H01 | H01 | H02 | H02 | H03 | H04 |
| | Treatment temperature (° C.) | 70 | 50 | 50 | 70 | 50 | 400 |
| | Treatment time (min) | 30 | 30 | 30 | 15 | 360 | 60 |
| | Passivation treatment | A01 | A01 | A01 | A01 | A01 | A01 |
| | Treatment temperature (° C.) | 90 | 90 | 90 | 90 | 90 | 90 |
| | Treatment time (min) | 10 | 10 | 10 | 10 | 10 | 10 |
| | Stabilization treatment | B09 | B09 | B09 | B09 | B09 | B09 |
| | Treatment temperature (° C.) | 100 | 100 | 100 | 100 | 100 | 100 |
| | Treatment time (min) | 5 | 5 | 5 | 5 | 5 | 5 |
| Properties of surface | $[I_{Ti-H}/(I_{Ti} + I_{T-H})] \times 100$ (%) | 85 | 56 | 65 | 61 | 75 | 62 |
| | Thickness of titanium oxide coating film (nm) | 7 | 6 | 7 | 7 | 6 | 7 |
| | Concentration of C, N, and B (result of XPS) | A | A | A | A | A | A |
| Contact electrical conductivity Deterioration test 1 | Before deterioration test (mΩ · cm²) | 7 | 7 | 7 | 7 | 6 | 6 |
| | After deterioration test (mΩ · cm²) | 8 | 9 | 8 | 8 | 8 | 8 |
| | Evaluative determination | A | A | A | A | A | A |
| Contact electrical conductivity Deterioration test 2 | Before deterioration test (mΩ · cm²) | 7 | 7 | 7 | 7 | 6 | 6 |
| | After deterioration test (mΩ · cm²) | 8 | 9 | 7 | 7 | 8 | 8 |
| | Evaluative determination | A | A | A | A | A | A |

The results when the treatment time and the treatment temperature were varied in the passivation treatment are shown in Table 3.

TABLE 3

| | | Implementation No. | | | | |
|---|---|---|---|---|---|---|
| | | 3-1 Present Invention Example | 3-2 Present Invention Example | 3-3 Present Invention Example | 3-4 Present Invention Example | 3-5 Present Invention Example |
| | Summary | | | | | |
| Material | Base material | M01 | M01 | M01 | M01 | M01 |
| Treatment method | Pre-treatment | P01 | P01 | P01 | P01 | P01 |
| | Hydride formation treatment | H01 | H01 | H01 | H01 | H01 |
| | Treatment temperature (° C.) | 70 | 70 | 70 | 70 | 70 |
| | Treatment time (min) | 25 | 25 | 25 | 25 | 25 |
| | Passivation treatment | A01 | A01 | A01 | A01 | A01 |
| | Treatment temperature (° C.) | 90 | 90 | 90 | 90 | 90 |
| | Treatment time (min) | 1 | 5 | 10 | 20 | 30 |
| | Stabilization treatment | B09 | B09 | B09 | B09 | B09 |
| | Treatment temperature (° C.) | 100 | 100 | 100 | 100 | 100 |
| | Treatment time (min) | 5 | 5 | 5 | 5 | 5 |
| Properties of surface | $[I_{Ti-H}/(I_{Ti} + I_{T-H})] \times 100$ (%) | 77 | 79 | 79 | 76 | 78 |
| | Thickness of titanium oxide coating film (nm) | 3 | 5 | 7 | 7 | 8 |
| | Concentration of C, N, and B (result of XPS) | A | A | A | A | A |
| Contact electrical conductivity Deterioration test 1 | Before deterioration test (mΩ · cm$^2$) | 6 | 7 | 7 | 7 | 8 |
| | After deterioration test (mΩ · cm$^2$) | 10 | 8 | 8 | 8 | 8 |
| | Evaluative determination | A | A | A | A | A |
| Contact electrical conductivity Deterioration test 2 | Before deterioration test (mΩ · cm$^2$) | 6 | 7 | 7 | 7 | 8 |
| | After deterioration test (mΩ · cm$^2$) | 9 | 8 | 8 | 8 | 8 |
| | Evaluative determination | A | A | A | A | A |

| | | Implementation No. | | | | |
|---|---|---|---|---|---|---|
| | | 3-6 Present Invention Example | 3-7 Comparative Example | 3-8 Comparative Example | 3-9 Present Invention Example | 3-10 Present Invention Example |
| | Summary | | | | | |
| Material | Base material | M01 | M01 | M01 | M01 | M01 |
| Treatment method | Pre-treatment | P01 | P01 | P01 | P01 | P01 |
| | Hydride formation treatment | H01 | H01 | H01 | H01 | H01 |
| | Treatment temperature (° C.) | 70 | 70 | 70 | 70 | 70 |
| | Treatment time (min) | 25 | 25 | 25 | 25 | 25 |
| | Passivation treatment | A01 | A01 | A01 | A01 | A01 |
| | Treatment temperature (° C.) | 90 | 90 | 25 | 50 | 100 |
| | Treatment time (min) | 40 | 50 | 10 | 10 | 10 |
| | Stabilization treatment | B09 | B09 | B09 | B09 | B09 |
| | Treatment temperature (° C.) | 100 | 100 | 100 | 100 | 100 |
| | Treatment time (min) | 5 | 5 | 5 | 5 | 5 |
| Properties of surface | $[I_{Ti-H}/(I_{Ti} + I_{T-H})] \times 100$ (%) | 80 | 79 | 77 | 77 | 78 |
| | Thickness of titanium oxide coating film (nm) | 10 | 12 | 2 (—) | 5 | 9 |
| | | | | (—) | | |
| | Concentration of C, N, and B (result of XPS) | A | A | A | A | A |
| Contact electrical conductivity Deterioration test 1 | Before deterioration test (mΩ · cm$^2$) | 9 | 12 | 6 | 7 | 7 |
| | After deterioration test (mΩ · cm$^2$) | 14 | 32 | 76 | 8 | 8 |
| | Evaluative determination | B | C | C | A | A |
| Contact electrical conductivity Deterioration test 2 | Before deterioration test (mΩ · cm$^2$) | 9 | 12 | 6 | 7 | 7 |
| | After deterioration test (mΩ · cm$^2$) | 13 | 24 | 26 | 8 | 8 |
| | Evaluative determination | A | C | C | A | A |

The results when the treatment liquid was changed in the passivation treatment are shown in Table 4.

TABLE 4

| | | Implementation No. | | | | |
|---|---|---|---|---|---|---|
| | | 4-1 Present Invention Example | 4-2 Present Invention Example | 4-3 Present Invention Example | 4-4 Present Invention Example | 4-5 Present Invention Example |
| | Summary | | | | | |
| Material | Base material | M02 | M01 | M01 | M01 | M01 |
| Treatment method | Pre-treatment | P01 | P01 | P01 | P01 | P01 |
| | Hydride formation treatment | H01 | H01 | H01 | H01 | H01 |
| | Treatment temperature (° C.) | 70 | 70 | 70 | 70 | 70 |
| | Treatment time (min) | 25 | 25 | 25 | 25 | 25 |
| | Passivation treatment | A01 | A02 | A03 | A04 | A05 |
| | Treatment temperature (° C.) | 90 | 90 | 90 | 90 | 90 |
| | Treatment time (min) | 5 | 5 | 5 | 5 | 5 |

TABLE 4-continued

| | | | | | | |
|---|---|---|---|---|---|---|
| | Stabilization treatment | B09 | B09 | B09 | B09 | B09 |
| | Treatment temperature (° C.) | 100 | 100 | 100 | 100 | 100 |
| | Treatment time (min) | 5 | 5 | 5 | 5 | 5 |
| Properties of surface | $[I_{Ti-H}/(I_{Ti} + I_{T-H})] \times 100$ (%) | 78 | 77 | 78 | 77 | 76 |
| | Thickness of titanium oxide coating film (nm) | 7 | 6 | 6 | 4 | 8 |
| | Concentration of C, N, and B (result of XPS) | A | A | A | A | A |
| Contact electrical conductivity | Before deterioration test (mΩ · cm²) | 7 | 6 | 6 | 6 | 6 |
| Deterioration test 1 | After deterioration test (mΩ · cm²) | 8 | 7 | 7 | 8 | 8 |
| | Evaluative determination | A | A | A | A | A |
| Contact electrical conductivity | Before deterioration test (mΩ · cm²) | 7 | 6 | 6 | 6 | 6 |
| Deterioration test 2 | After deterioration test (mΩ · cm²) | 8 | 8 | 8 | 8 | 7 |
| | Evaluative determination | A | A | A | A | A |

| | | Implementation No. | | | |
|---|---|---|---|---|---|
| | | 4-6 | 4-7 | 4-8 | 4-9 |
| | | Present Invention Example | Present Invention Example | Present Invention Example | Present Invention Example |
| | Summary | | | | |
| Material | Base material | M01 | M01 | M01 | M01 |
| Treatment method | Pre-treatment | P01 | P01 | P01 | P01 |
| | Hydride formation treatment | H01 | H01 | H01 | H01 |
| | Treatment temperature (° C.) | 70 | 70 | 70 | 70 |
| | Treatment time (min) | 25 | 25 | 25 | 25 |
| | Passivation treatment | A06 | A07 | A08 | A09 |
| | Treatment temperature (° C.) | 90 | 90 | 90 | 90 |
| | Treatment time (min) | 5 | 5 | 5 | 5 |
| | Stabilization treatment | B09 | B09 | B09 | B09 |
| | Treatment temperature (° C.) | 100 | 100 | 100 | 100 |
| | Treatment time (min) | 5 | 5 | 5 | 5 |
| Properties of surface | $[I_{Ti-H}/(I_{Ti} + I_{T-H})] \times 100$ (%) | 76 | 79 | 78 | 79 |
| | Thickness of titanium oxide coating film (nm) | 6 | 7 | 4 | 5 |
| | Concentration of C, N, and B (result of XPS) | A | A | A | A |
| Contact electrical conductivity | Before deterioration test (mΩ · cm²) | 5 | 7 | 7 | 7 |
| Deterioration test 1 | After deterioration test (mΩ · cm²) | 7 | 8 | 8 | 8 |
| | Evaluative determination | A | A | A | A |
| Contact electrical conductivity | Before deterioration test (mΩ · cm²) | 5 | 7 | 7 | 7 |
| Deterioration test 2 | After deterioration test (mΩ · cm²) | 7 | 8 | 8 | 8 |
| | Evaluative determination | A | A | A | A |

The results when the treatment liquid was changed in the stabilization treatment are shown in Table 5.

TABLE 5

| | | Implementation No. | | | | | |
|---|---|---|---|---|---|---|---|
| | | 5-1 | 5-2 | 5-3 | 5-4 | 5-5 | 5-6 |
| | | Present Invention Example | Present Invention Example | Present Invention Example | Present Invention Example | Present Invention Example | Present Invention Example |
| | Summary | | | | | | |
| Material | Base material | M01 | M01 | M01 | M01 | M01 | M01 |
| Treatment method | Pre-treatment | P01 | P01 | P01 | P01 | P01 | P01 |
| | Hydride formation treatment | H01 | H01 | H01 | H01 | H01 | H01 |
| | Treatment temperature (° C.) | 70 | 70 | 70 | 70 | 70 | 70 |
| | Treatment time (min) | 25 | 25 | 25 | 25 | 25 | 25 |
| | Passivation treatment | A01 | A01 | A01 | A01 | A01 | A01 |
| | Treatment temperature (° C.) | 90 | 90 | 90 | 90 | 90 | 90 |
| | Treatment time (min) | 10 | 10 | 10 | 10 | 10 | 10 |
| | Stabilization treatment | B01 | B02 | B03 | B04 | B05 | B06 |
| | Treatment temperature (° C.) | 100 | 100 | 100 | 100 | 100 | 100 |
| | Treatment time (min) | 5 | 5 | 5 | 5 | 5 | 5 |
| Properties of surface | $[I_{Ti-H}/(I_{Ti} + I_{T-H})] \times 100$ (%) | 77 | 78 | 77 | 76 | 76 | 79 |
| | Thickness of titanium oxide coating film (nm) | 7 | 7 | 7 | 8 | 6 | 7 |
| | Concentration of C, N, and B (result of XPS) | A | A | A | A | A | A |
| Contact electrical conductivity | Before deterioration test (mΩ · cm²) | 7 | 7 | 6 | 6 | 6 | 6 |
| Deterioration test 1 | After deterioration test (mΩ · cm²) | 8 | 8 | 7 | 8 | 8 | 7 |
| | Evaluative determination | A | A | A | A | A | A |
| Contact electrical conductivity | Before deterioration test (mΩ · cm²) | 7 | 7 | 6 | 6 | 6 | 6 |
| Deterioration test 2 | After deterioration test (mΩ · cm²) | 8 | 8 | 7 | 7 | 7 | 7 |
| | Evaluative determination | A | A | A | A | A | A |

TABLE 5-continued

|  |  | Implementation No. | | | | | |
| --- | --- | --- | --- | --- | --- | --- | --- |
|  | Summary | 5-7 Present Invention Example | 5-8 Present Invention Example | 5-9 Present Invention Example | 5-10 Present Invention Example | 5-11 Present Invention Example | 5-12 Present Invention Example |
| Material | Base material | M01 | M01 | M01 | M01 | M01 | M01 |
| Treatment method | Pre-treatment | P01 | P01 | P01 | P01 | P01 | P01 |
|  | Hydride formation treatment | H01 | H01 | H01 | H01 | H01 | H01 |
|  | Treatment temperature (° C.) | 70 | 70 | 70 | 70 | 70 | 70 |
|  | Treatment time (min) | 25 | 25 | 25 | 25 | 25 | 25 |
|  | Passivation treatment | A01 | A01 | A01 | A01 | A01 | A01 |
|  | Treatment temperature (° C.) | 90 | 90 | 90 | 90 | 90 | 90 |
|  | Treatment time (min) | 10 | 10 | 10 | 10 | 10 | 10 |
|  | Stabilization treatment | B07 | B08 | B10 | B11 | B12 | B13 |
|  | Treatment temperature (° C.) | 100 | 100 | 100 | 100 | 100 | 100 |
|  | Treatment time (min) | 5 | 5 | 5 | 5 | 5 | 5 |
| Properties of surface | $[I_{Ti-H}/(I_{Ti} + I_{T-H})] \times 100$ (%) | 78 | 79 | 78 | 78 | 78 | 78 |
|  | Thickness of titanium oxide coating film (nm) | 5 | 6 | 7 | 8 | 7 | 7 |
|  | Concentration of C, N, and B (result of XPS) | A | A | A | A | A | A |
| Contact electrical conductivity | Before deterioration test (mΩ · cm$^2$) | 7 | 7 | 7 | 7 | 6 | 7 |
| Deterioration test 1 | After deterioration test (mΩ · cm$^2$) | 8 | 8 | 8 | 8 | 8 | 8 |
|  | Evaluative determination | A | A | A | A | A | A |
| Contact electrical conductivity | Before deterioration test (mΩ · cm$^2$) | 7 | 7 | 7 | 7 | 6 | 7 |
| Deterioration test 2 | After deterioration test (mΩ · cm$^2$) | 8 | 8 | 8 | 8 | 7 | 8 |
|  | Evaluative determination | A | A | A | A | A | A |

The results when the treatment temperature was varied in the stabilization treatment are shown in Table 6.

TABLE 6

|  |  | Implementation No. | | | | | | |
| --- | --- | --- | --- | --- | --- | --- | --- | --- |
|  | Summary | 6-1 Present Invention Example | 6-2 Present Invention Example | 6-3 Present Invention Example | 6-4 Present Invention Example | 6-5 Present Invention Example | 6-6 Present Invention Example | 6-7 Present Invention Example |
| Material | Base material | M01 | M01 | M01 | M01 | M01 | M01 | M01 |
| Treatment method | Pre-treatment | P01 | P01 | P01 | P01 | P01 | P01 | P01 |
|  | Hydride formation treatment | H01 | H01 | H01 | H01 | H01 | H01 | H01 |
|  | Treatment temperature (° C.) | 70 | 70 | 70 | 70 | 70 | 70 | 70 |
|  | Treatment time (min) | 25 | 25 | 25 | 15 | 15 | 15 | 15 |
|  | Passivation treatment | A01 | A01 | A01 | A01 | A01 | A01 | A01 |
|  | Treatment temperature (° C.) | 90 | 90 | 90 | 90 | 90 | 90 | 90 |
|  | Treatment time (min) | 10 | 10 | 10 | 10 | 10 | 10 | 10 |
|  | Stabilization treatment | B09 | B09 | B09 | B09 | B09 | B09 | B09 |
|  | Treatment temperature (° C.) | 40 | 60 | 80 | 40 | 60 | 80 | 100 |
|  | Treatment time (min) | 5 | 5 | 5 | 5 | 5 | 5 | 5 |
| Properties of surface | $[I_{Ti-H}/(I_{Ti} + I_{T-H})] \times 100$ (%) | 79 | 78 | 78 | 56 | 55 | 55 | 56 |
|  | Thickness of titanium oxide coating film (nm) | 5 | 6 | 6 | 5 | 5 | 6 | 7 |
|  | Concentration of C, N, and B (result of XPS) | A | A | A | A | A | A | A |
| Contact electrical conductivity Deterioration test 1 | Before deterioration test (mΩ · cm$^2$) | 6 | 7 | 7 | 6 | 6 | 7 | 7 |
|  | After deterioration test (mΩ · cm$^2$) | 15 | 9 | 8 | 17 | 10 | 8 | 8 |
|  | Evaluative determination | B | A | A | B | A | A | A |
| Contact electrical conductivity Deterioration test 2 | Before deterioration test (mΩ · cm$^2$) | 6 | 7 | 7 | 6 | 6 | 7 | 7 |
|  | After deterioration test (mΩ · cm$^2$) | 14 | 9 | 8 | 16 | 9 | 9 | 8 |
|  | Evaluative determination | B | A | A | B | A | A | A |

The results when various conditions were changed are shown in Table 7.

TABLE 7

| | | Implementation No. | | | | | | |
|---|---|---|---|---|---|---|---|---|
| | | 7-1 Present Invention Example | 7-2 Present Invention Example | 7-3 Present Invention Example | 7-4 Present Invention Example | 7-5 Present Invention Example | 7-6 Present Invention Example | 7-7 Present Invention Example |
| | Summary | | | | | | | |
| Material | Base material | M02 | M02 | M02 | M02 | M02 | M03 | M04 |
| Treatment method | Pre-treatment | P02 | P01 | P01 | P01 | P01 | P01 | P01 |
| | Hydride formation treatment | H01 | H02 | H02 | H03 | H04 | H01 | H01 |
| | Treatment temperature (° C.) | 50 | 50 | 70 | 50 | 400 | 70 | 70 |
| | Treatment time (min) | 30 | 30 | 15 | 360 | 60 | 15 | 15 |
| | Passivation treatment | A01 | A01 | A01 | A01 | A01 | A01 | A01 |
| | Treatment temperature (° C.) | 90 | 90 | 90 | 90 | 90 | 90 | 90 |
| | Treatment time (min) | 10 | 10 | 10 | 10 | 5 | 5 | 5 |
| | Stabilization treatment | B09 | B09 | B09 | B09 | B09 | B09 | B09 |
| | Treatment temperature (° C.) | 80 | 80 | 100 | 100 | 80 | 80 | 80 |
| | Treatment time (min) | 5 | 5 | 5 | 5 | 5 | 5 | 5 |
| Properties of surface | $[I_{Ti-H}/(I_{Ti} + I_{T-H})] \times 100$ (%) | 56 | 64 | 62 | 77 | 61 | 56 | 56 |
| | Thickness of titanium oxide coating film (nm) | 6 | 6 | 6 | 5 | 5 | 6 | 7 |
| | Concentration of C, N, and B (result of XPS) | A | A | A | A | A | A | A |
| Contact electrical conductivity Deterioration test 1 | Before deterioration test (mΩ·cm$^2$) | 7 | 7 | 7 | 6 | 6 | 7 | 7 |
| | After deterioration test (mΩ·cm$^2$) | 9 | 8 | 8 | 8 | 8 | 9 | 9 |
| | Evaluative determination | A | A | A | A | A | A | A |
| Contact electrical conductivity Deterioration test 2 | Before deterioration test (mΩ·cm$^2$) | 7 | 7 | 7 | 6 | 6 | 7 | 7 |
| | After deterioration test (mΩ·cm$^2$) | 9 | 8 | 8 | 7 | 8 | 9 | 8 |
| | Evaluative determination | A | A | A | A | A | A | A |

From Tables 1 to 7, it is found that the contact electrical conductivity of the present invention examples is much better than the contact electrical conductivity of the comparative examples (conventional materials).

INDUSTRIAL APPLICABILITY

As described above, according to the present invention, it becomes possible to provide a titanium or a titanium alloy material for a fuel cell separator having good contact-to-carbon electrical conductivity and good durability and a fuel cell separator having good contact-to-carbon electrical conductivity and good durability. When the fuel cell separator is used, the lifetime of the fuel cell can be greatly prolonged. Thus, the present invention has high applicability in battery manufacturing industries.

REFERENCE SIGNS LIST

1 Ti (titanium or titanium alloy material)
2 titanium oxide film

The invention claimed is:

1. A titanium material or a titanium alloy material, wherein
   the composition ratio of a titanium hydride $[I_{Ti-H}/(I_{Ti}+I_{Ti-H})] \times 100$ found from the maximum intensity of metal titanium ($I_{Ti}$) and the maximum intensity of the titanium hydride ($I_{Ti-H}$) of the X-ray diffraction peaks measured at a surface of a titanium or a titanium alloy at an incident angle to the surface of 0.3° is 55% or more,
   a titanium oxide film is formed on an outermost surface of the titanium or the titanium alloy,
   C is at 10 atomic % or less, N is at 1 atomic % or less, and B is at 1 atomic % or less in a position where the surface has been subjected to sputtering of 5 nm with argon, and
   each of the amounts of increase in contact resistance from before to after deterioration test 1 and deterioration test 2 below is 10 mΩcm$^2$ or less,
   deterioration test 1: immersion for 4 days in a sulfuric acid solution at 80° C. and pH 3 containing 2 ppm F ions,
   deterioration test 2: application of an electric potential of 1.0 V (vs. SHE) for 24 hours in a sulfuric acid solution at 80° C. and pH 3.

2. A fuel cell separator comprising the titanium material or the titanium alloy material according to claim 1.

3. A polymer electrolyte fuel cell comprising the fuel cell separator according to claim 2.

* * * * *